United States Patent
Brown et al.

(10) Patent No.: US 8,472,148 B2
(45) Date of Patent: Jun. 25, 2013

(54) SELF-ALIGNED DOUBLE FLUX GUIDED TMR SENSOR

(75) Inventors: Diane L. Brown, San Jose, CA (US); Edward Hin Pong Lee, San Jose, CA (US); David John Seagle, Morgan Hill, CA (US)

(73) Assignee: HGST Netherlands B.V., Amsterdam (NL)

( * ) Notice: Subject to any disclaimer, the term of this patent is extended or adjusted under 35 U.S.C. 154(b) by 867 days.

(21) Appl. No.: 12/508,843

(22) Filed: Jul. 24, 2009

(65) Prior Publication Data

US 2011/0019313 A1 Jan. 27, 2011

(51) Int. Cl.
*G11B 5/33* (2006.01)

(52) U.S. Cl.
USPC ........................................................ 360/321

(58) Field of Classification Search
USPC ................... 360/321, 319, 313, 324.2, 324.1, 360/324.11, 324.12
See application file for complete search history.

(56) References Cited

U.S. PATENT DOCUMENTS

| | | | |
|---|---|---|---|
| 5,636,093 A | 6/1997 | Gijs et al. | 360/126 |
| 6,223,420 B1 | 5/2001 | Lee et al. | 29/603.14 |
| 6,344,954 B1 | 2/2002 | Redon et al. | 360/324.2 |
| 6,504,689 B1 | 1/2003 | Gill et al. | 360/324.2 |
| 6,542,343 B1 | 4/2003 | Gill | 360/324.2 |
| 6,657,825 B2* | 12/2003 | Ho et al. | 360/321 |
| 6,665,152 B2 | 12/2003 | Nemoto | 360/319 |
| 6,721,139 B2 | 4/2004 | Gill | 360/321 |
| 6,778,363 B2 | 8/2004 | Meguro et al. | 360/324.11 |
| 7,036,208 B2* | 5/2006 | Ho et al. | 29/603.13 |
| 7,102,854 B2* | 9/2006 | Wang et al. | 360/125.5 |
| 7,149,045 B1* | 12/2006 | Mallary et al. | 360/55 |
| 7,170,721 B2 | 1/2007 | Wu | 360/321 |
| 7,237,322 B2 | 7/2007 | Gill | 29/603.13 |
| 7,243,412 B2 | 7/2007 | Furukawa et al. | 29/603.14 |
| 7,352,540 B1 | 4/2008 | Watson et al. | 360/321 |
| 7,461,933 B2* | 12/2008 | Deily et al. | 347/102 |
| 7,486,475 B2* | 2/2009 | Biskeborn | 360/121 |
| 7,679,862 B2* | 3/2010 | Nakamoto et al. | 360/125.32 |
| 7,751,156 B2* | 7/2010 | Mauri et al. | 360/324.2 |
| 7,830,641 B2* | 11/2010 | Lin | 360/324.2 |
| 7,839,605 B2* | 11/2010 | Parker | 360/318 |
| 7,957,094 B1* | 6/2011 | Liu et al. | 360/97.12 |

(Continued)

FOREIGN PATENT DOCUMENTS

JP 2000/076627 3/2000

OTHER PUBLICATIONS

"Research Disclosure: Flux guide/tunnel valve structure with conducting contiguous junction" International Business Machines Corporation, Research Disclosure Database No. 440152 Published in Dec. 2000.

(Continued)

*Primary Examiner* — Allen T Cao
(74) *Attorney, Agent, or Firm* — Zilka-Kotab, PC

(57) ABSTRACT

A magnetic head according to one embodiment includes an array of sensor structures formed on a common substrate. Each sensor structure further comprises: a magnetic tunnel junction sensor spaced from a media-facing surface of the head; and a flux guide between the media-facing surface of the head and the sensor, the flux guide guiding magnetic flux from a magnetic medium adjacent the media-facing surface to the sensor. Additional systems and methods are also presented.

22 Claims, 9 Drawing Sheets

U.S. PATENT DOCUMENTS

| | | | |
|---|---|---|---|
| 2003/0035249 A1* | 2/2003 | Ho et al. ........................ | 360/321 |
| 2003/0206384 A1* | 11/2003 | Hoshiya et al. ........... | 360/324.12 |
| 2004/0017639 A1* | 1/2004 | Deak ............................. | 360/290 |
| 2004/0061979 A1* | 4/2004 | Ho et al. ........................ | 360/321 |
| 2006/0152851 A1* | 7/2006 | Biskeborn et al. ............ | 360/126 |
| 2007/0121249 A1* | 5/2007 | Parker ........................... | 360/126 |
| 2007/0164264 A1* | 7/2007 | Lenssen et al. ................... | 257/1 |
| 2007/0230068 A1* | 10/2007 | Gill ............................ | 360/324.2 |
| 2008/0042779 A1* | 2/2008 | Carey et al. ................... | 333/167 |
| 2008/0080101 A1* | 4/2008 | Mauri et al. ............... | 360/324.2 |
| 2008/0204945 A1* | 8/2008 | Freitag et al. ............ | 360/324.11 |
| 2008/0259507 A1* | 10/2008 | Lin ............................ | 360/324.1 |
| 2009/0168267 A1* | 7/2009 | Lin ............................ | 360/324.2 |
| 2009/0323228 A1* | 12/2009 | Carey et al. .................... | 360/319 |
| 2010/0302681 A1* | 12/2010 | Mino et al. ............... | 360/125.03 |
| 2011/0027618 A1* | 2/2011 | Lee et al. ................... | 428/811.2 |

OTHER PUBLICATIONS

"Construction of Tunnel Junction head with flux guides" Research Disclosure, Jan. 2000.

\* cited by examiner

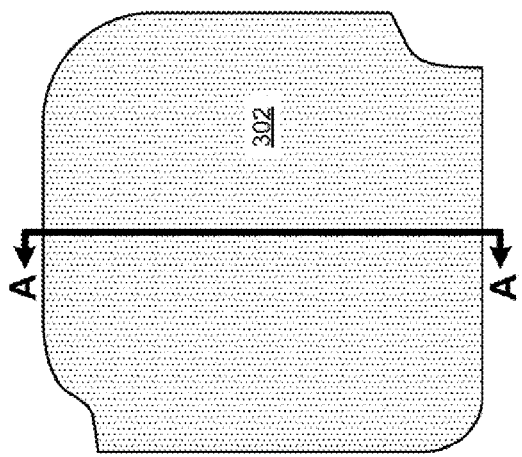
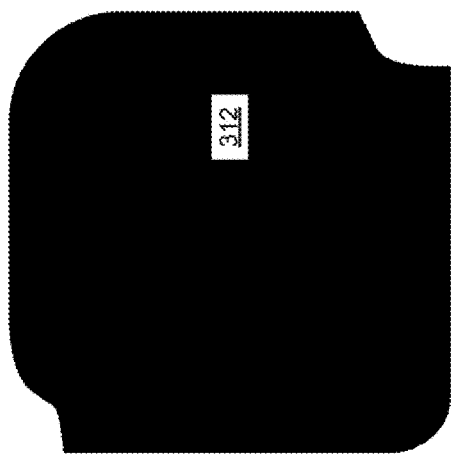
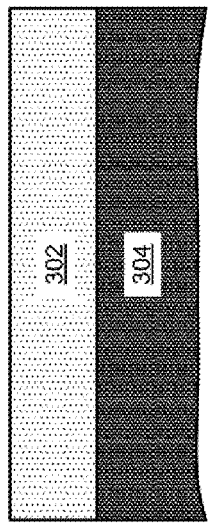
FIG. 3A
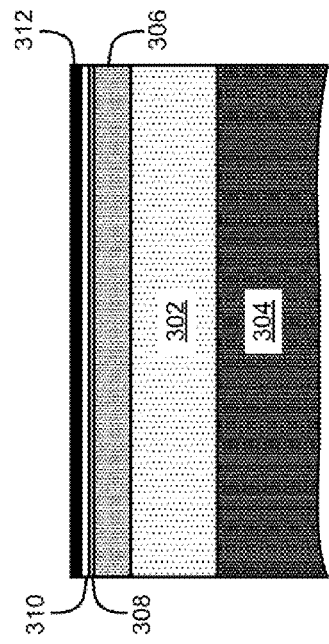
FIG. 3B

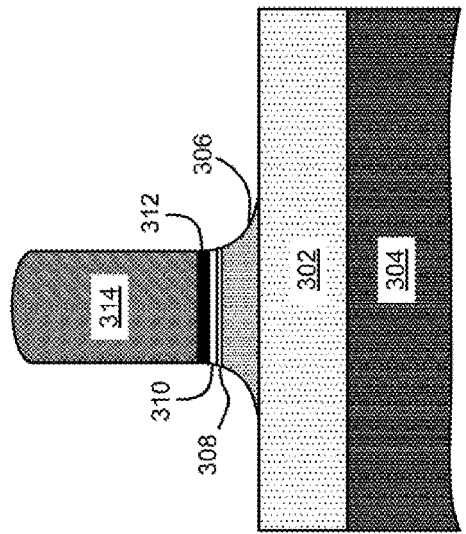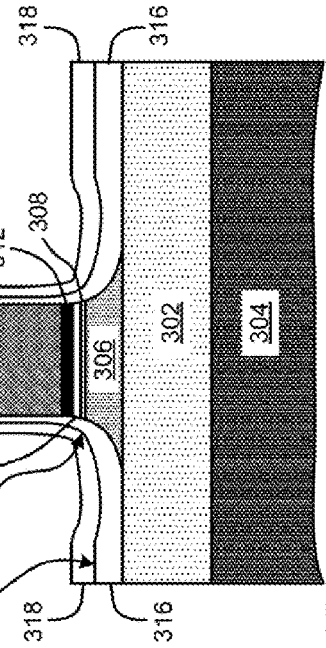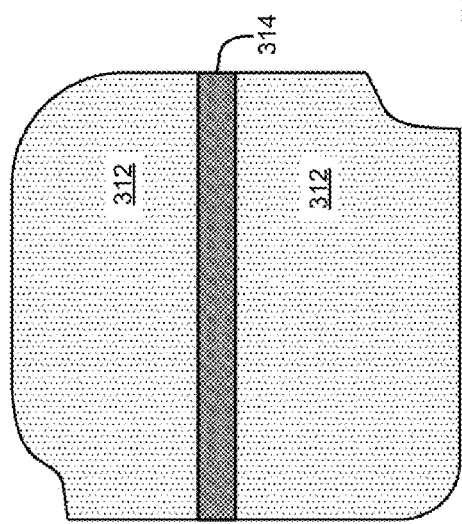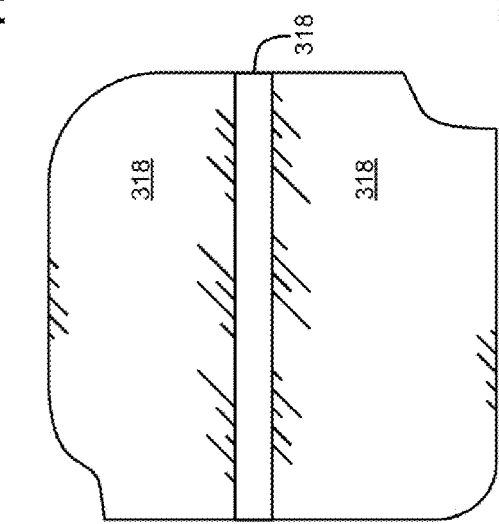
FIG. 3C
FIG. 3D

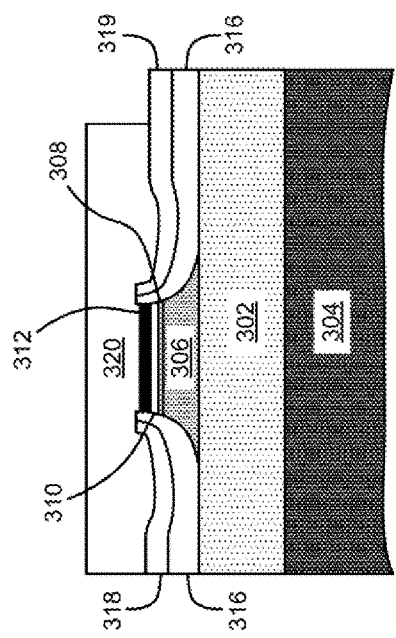
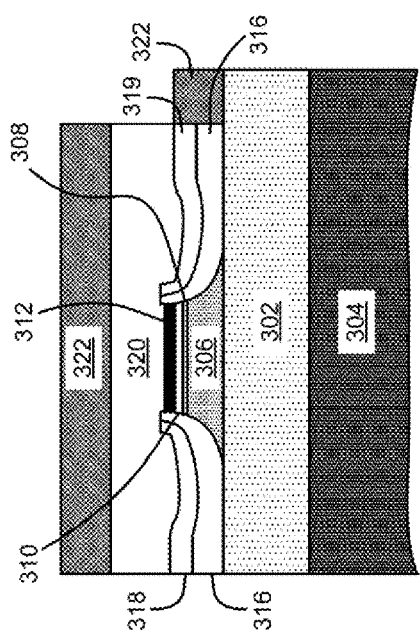
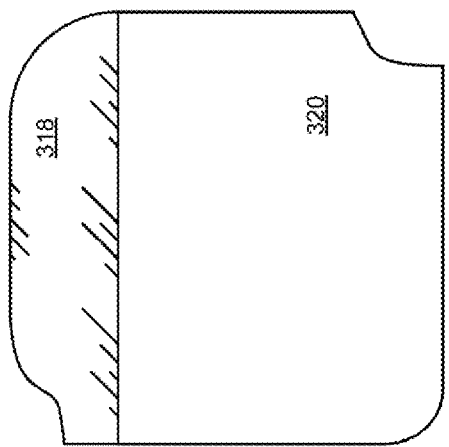
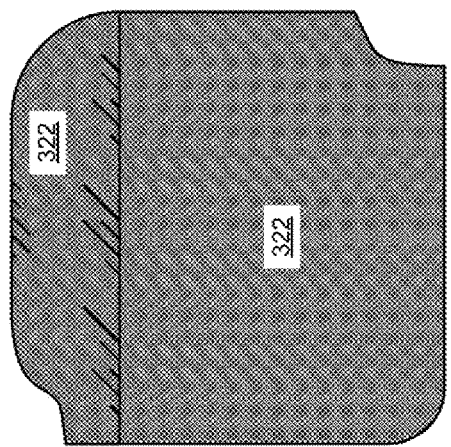
FIG. 3E
FIG. 3F

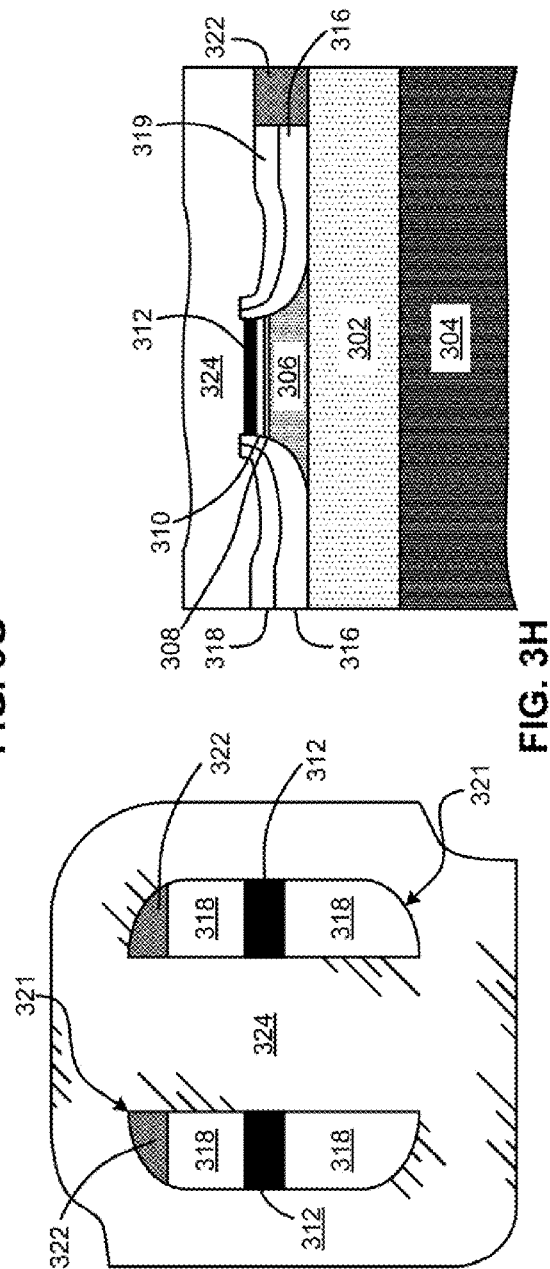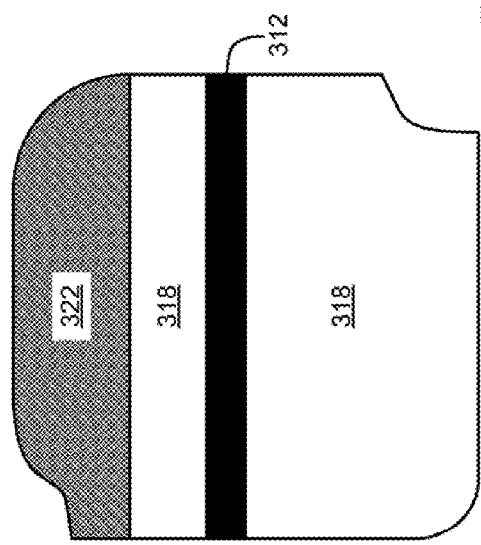

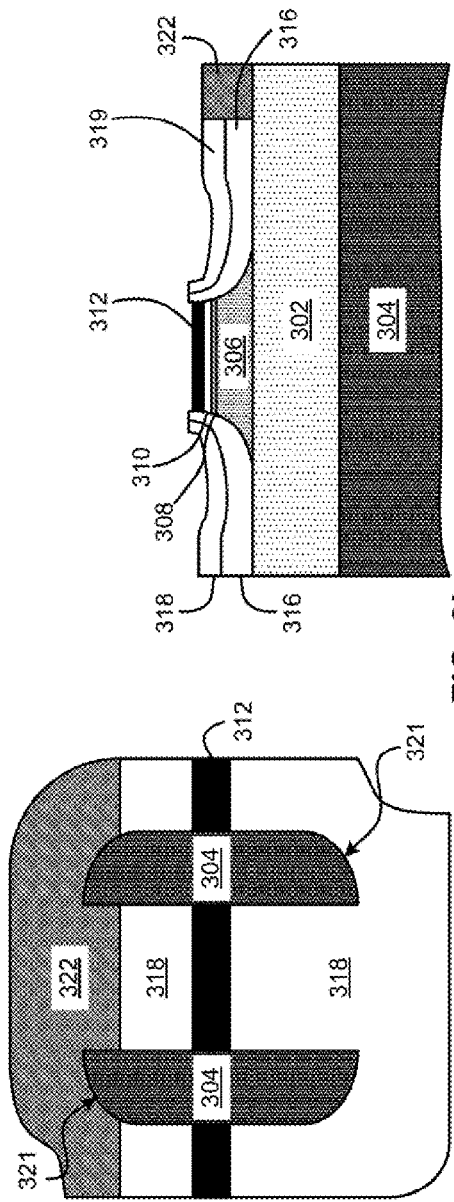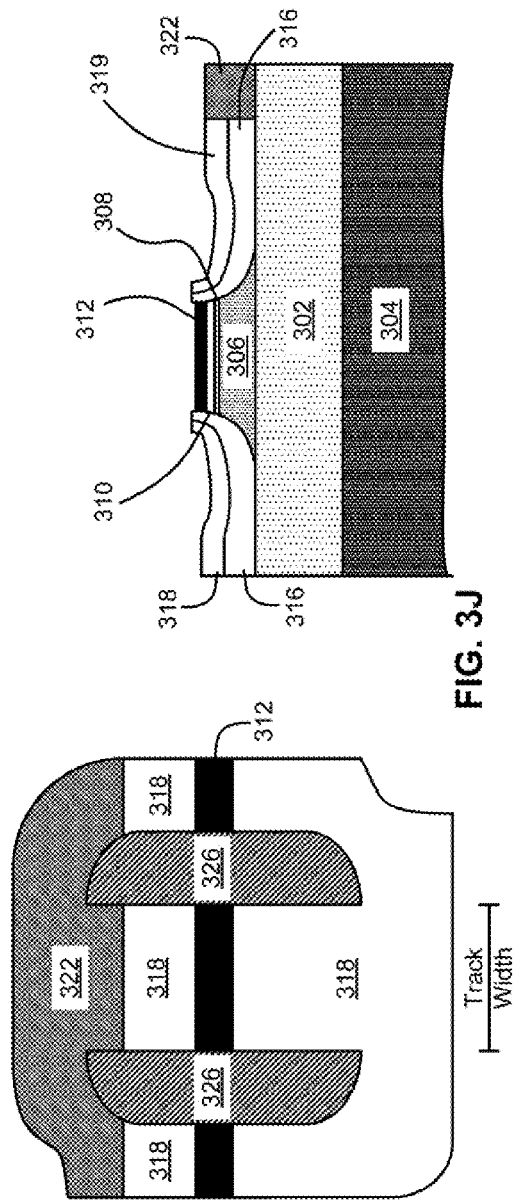
FIG. 3I
FIG. 3J

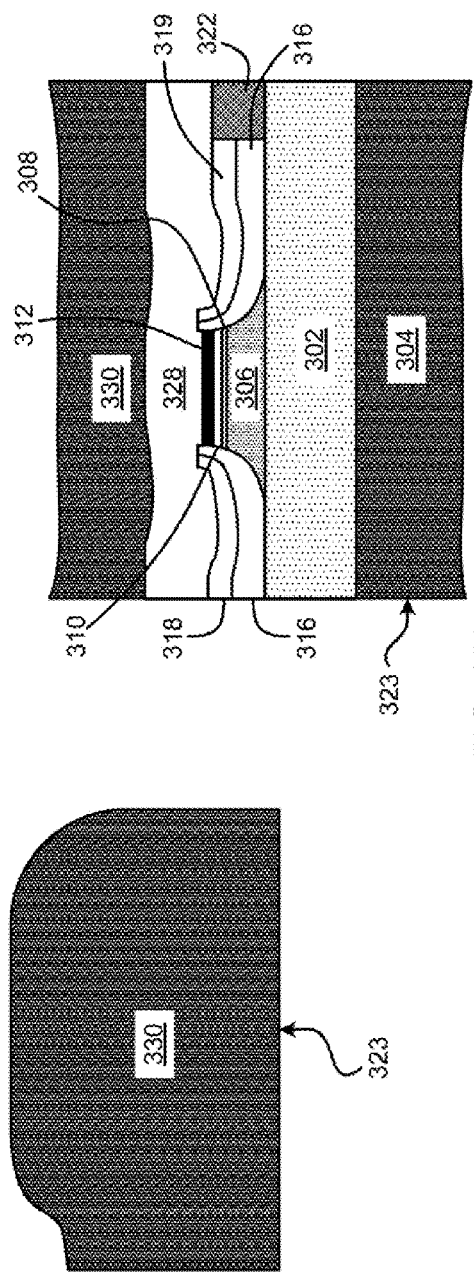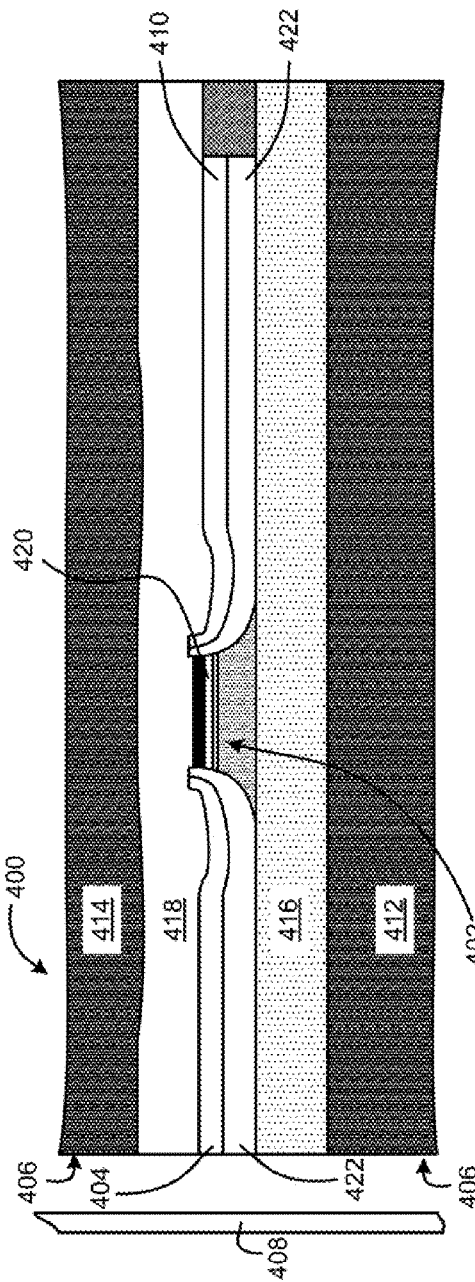

SELF-ALIGNED DOUBLE FLUX GUIDED TMR SENSOR

FIELD OF THE INVENTION

The present invention relates to tape data storage systems, and more particularly, this invention relates to improvements in design and processing techniques for making read back heads used in tape data storage systems.

BACKGROUND OF THE INVENTION

Magnetic tape data systems are used commonly to backup large amounts of data stored in other systems, such as on hard disk drives, optical drives, etc., which may be spread across many servers, networks, computers, etc. Magnetic tape data systems may be used for other activities as well, such as data storage for seldom accessed data, inexpensive data storage, etc.

Now referring to FIG. 1, a magnetic tape data system 100 generally includes a magnetic head 102 for reading and/or writing data onto a magnetic medium, such as a magnetic tape 104. The magnetic tape 104 is generally wound onto reels 114 for storage. The magnetic head 102 typically includes several transducers 106 that allow reading and/or writing of data to and/or from the magnetic tape 104. The magnetic tape data system 100 also includes a mechanism 108 for positioning the tape bearing surface (TBS) of the magnetic head 102 across the surface of the magnetic tape 104, and a drive motor 110 for moving the magnetic tape 104 across the magnetic head 102. Also, a controller 112 is generally connected to the magnetic head 102, mechanism 108 for positioning the TBS of the magnetic head 102, and drive motor 110. This arrangement of a magnetic tape data system 100 is well known in the art, and many other components useful in the control and/or operation of the magnetic tape data system may be included as well.

It would be beneficial for the magnetic tape industry to take advantage of high $\Delta R/R$ of Tunneling Magnetoresistive (TMR) heads. However, tape data systems are highly susceptible to scratching and smearing at the TBS during manufacturing processing and/or operation. Magnetic tapes generally use particulate media which is very abrasive, and tape data systems are not enclosed and particle generation is significantly detrimental to tape data system operation.

The smearing and/or scratching during operation is a concern to the tape industry because TMR heads are more prone to shorting caused by smearing and/or scratching than are other magnetic head types, such as Giant Magnetoresistive (GMR) heads. This is due to layers across the TBS being closer together in TMR heads than in GMR heads.

Therefore, a TMR head that can take advantage of increased $\Delta R/R$ and yet resist shorting would be beneficial to the magnetic tape industry.

SUMMARY OF THE INVENTION

A magnetic head according to one embodiment includes an array of sensor structures formed on a common substrate. Each sensor structure further comprises: a magnetic tunnel junction sensor spaced from a media-facing surface of the head; and a flux guide between the media-facing surface of the head and the sensor, the flux guide guiding magnetic flux from a magnetic medium adjacent the media-facing surface to the sensor.

A magnetic tape head according to another embodiment includes an array of sensor structures. Each sensor structure comprises a magnetic tunnel junction sensor spaced from a media-facing surface of the head; a flux guide between the media-facing surface of the head and the sensor, the flux guide guiding magnetic flux from a magnetic medium adjacent the media-facing surface to the sensor; a rear flux guide positioned behind the sensor relative to the media-facing surface; shield layers above and below the sensor; and nonmagnetic, electrically conductive gap layers between the sensor and the shield layers.

A method for forming a magnetic head according to one embodiment includes forming a magnetic tunnel junction sensor structure; removing a portion of the magnetic tunnel junction sensor structure for defining a sensor; depositing an insulating layer adjacent the sensor using a nonconformal deposition process, wherein the insulating layer has a greater thickness in a portion thereof away from the sensor than in a portion thereof nearest the sensor; and depositing a flux guide above the insulating layer.

Any of these embodiments may be implemented in a magnetic data storage system such as a magnetic tape system, which may include a magnetic head, a mechanism for passing a magnetic medium (e.g., magnetic tape) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 3A is a schematic representation of a top down view (left) and cross-sectional view (right) of a sensor structure manufacturing process according to one embodiment.

FIG. 3B is a schematic representation of a top down view (left) and cross-sectional view (right) of a sensor structure manufacturing process according to one embodiment.

FIG. 3C is a schematic representation of a top down view (left) and cross-sectional view (right) of a sensor structure manufacturing process according to one embodiment.

FIG. 3D is a schematic representation of a top down view (left) and cross-sectional view (right) of a sensor structure manufacturing process according to one embodiment.

FIG. 3E is a schematic representation of a top down view (left) and cross-sectional view (right) of a sensor structure manufacturing process according to one embodiment.

FIG. 3F is a schematic representation of a top down view (left) and cross-sectional view (right) of a sensor structure manufacturing process according to one embodiment.

FIG. 3G is a schematic representation of a top down view (left) and cross-sectional view (right) of a sensor structure manufacturing process according to one embodiment.

FIG. 3H is a schematic representation of a top down view (left) and cross-sectional view (right) of a sensor structure manufacturing process according to one embodiment.

FIG. 3I is a schematic representation of a top down view (left) and cross-sectional view (right) of a sensor structure manufacturing process according to one embodiment.

FIG. 3J is a schematic representation of a top down view (left) and cross-sectional view (right) of a sensor structure manufacturing process according to one embodiment.

FIG. 3K is a schematic representation of a top down view (left) and cross-sectional view (right) of a sensor structure manufacturing process according to one embodiment.

FIG. 4 is a schematic representation of a cross-sectional view of a sensor structure according to one embodiment.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of data storage systems and/or related systems and methods, as well as operation and/or component parts thereof.

In one general embodiment, a magnetic head comprises an array of sensor structures formed on a common substrate. Each sensor structure includes a magnetic tunnel junction sensor spaced from a media-facing surface of the head and a flux guide between the media-facing surface of the head and the sensor. The flux guide guides magnetic flux from a magnetic medium adjacent the media-facing surface to the sensor.

In another general embodiment, a magnetic tape head comprises an array of sensor structures. Each sensor structure includes a magnetic tunnel junction sensor spaced from a media-facing surface of the head, a flux guide between the media-facing surface of the head and the sensor, a rear flux guide positioned behind the sensor relative to the media-facing surface, shield layers above and below the sensor, and nonmagnetic, electrically conductive gap layers between the sensor and the shield layers. The flux guide guides magnetic flux from a magnetic medium adjacent the media-facing surface to the sensor.

In yet another general embodiment, a method for forming a magnetic head comprises forming a magnetic tunnel junction sensor structure and removing a portion of the magnetic tunnel junction sensor structure for defining a sensor. The method also includes depositing an insulating layer adjacent the sensor using a nonconformal deposition process and depositing a flux guide above the insulating layer. The insulating layer has a greater thickness in a portion thereof away from the sensor than in a portion thereof nearest the sensor.

Figure 1:
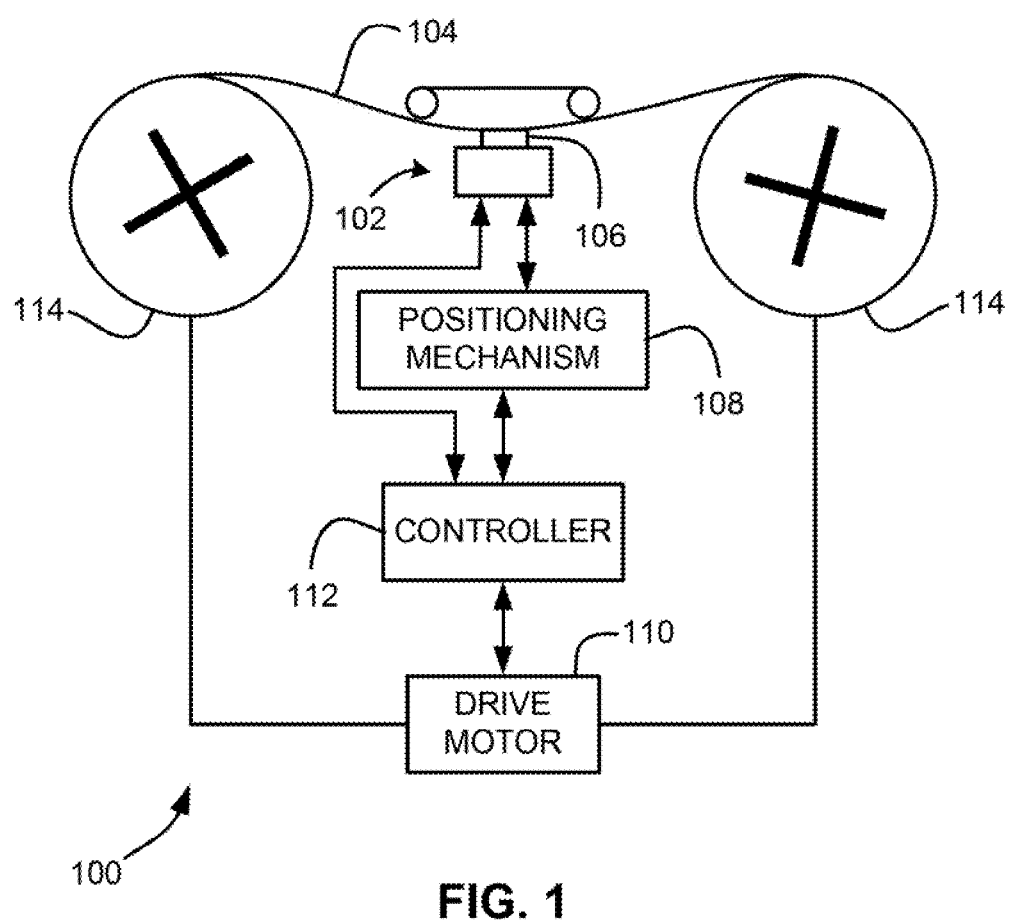
FIG. 1 is a simplified drawing of a magnetic recording tape system.
Figure 2C:
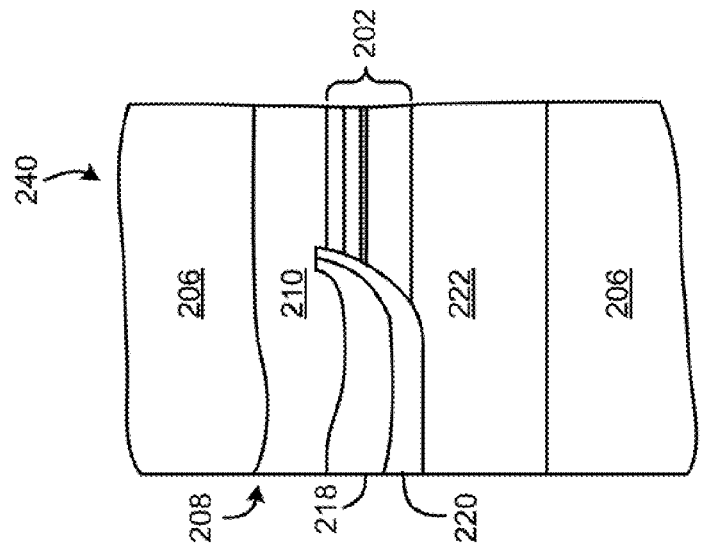
FIG. 2C is a schematic representation of a TMR sensor structure according to one embodiment.
Figure 2B:
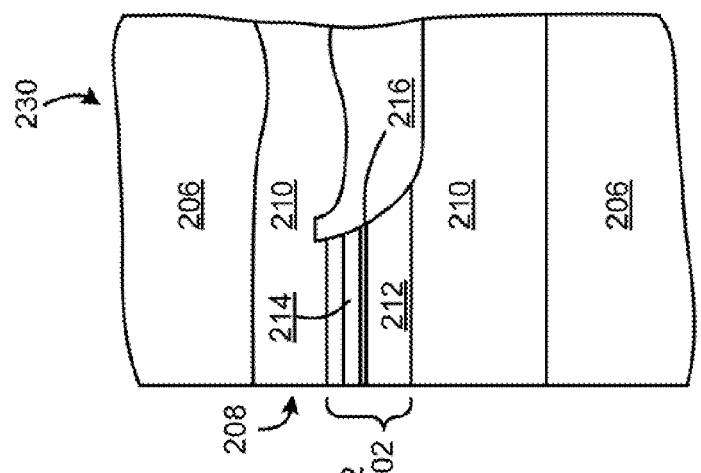
FIG. 2B is a schematic representation of a prior art TMR sensor structure.
Figure 2A:
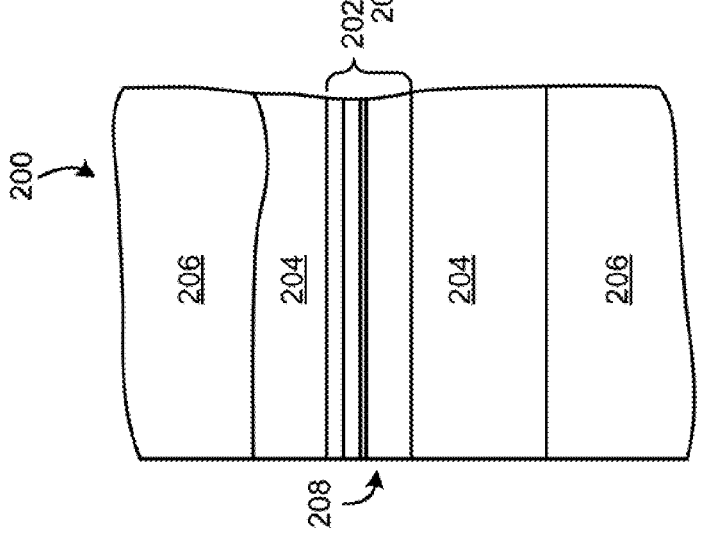
FIG. 2A is a schematic representation of a prior art Current-in-Plane GMR sensor structure.

With reference to FIG. 2A, a prior art Current-in-Plane (CIP) Giant Magnetoresistive (GMR) sensor structure 200 is shown. The sensor structure 200 includes a sensor 202, with insulating layers 204 above and below the sensor 202. Also, above and below the insulating layers 204 are shields 206. As can be seen, the sensor 202 is isolated from the shields 206 on the media bearing surface 208 by a good distance, generally about 60 nm gaps on either side. Therefore, there is little worry about smearing or scratching leading to shorting on this sensor design.

However, with reference to FIG. 2B, a prior art Current-Perpendicular-to-Plane (CPP) Tunneling Magnetoresistive (TMR) sensor structure 230 is shown. The sensor structure 230 includes a sensor 202, with metal gap layers 210 above and below the sensor 202. Also, above and below the metal gap layers 210 are shields 206. The free layer 214 of the sensor 202 is isolated from the reference layer 212 by a very thin barrier layer 216. Generally, this barrier layer 216 is only about 1 nm in thickness. As can be seen, the free layer 214 of the sensor 202 is not isolated from the reference layer 212 by very much distance, generally only about 1 nm provided by the barrier layer 216. Therefore, shorting is a very realistic problem associated with this sensor structure 230 due to smearing and/or scratching on the media facing side 208 of the structure 230.

Now referring to FIG. 2C, a CPP TMR sensor structure 240 is shown according to one embodiment. In this sensor structure 240, the sensor 202 is formed away from the media facing side 208 of the sensor structure 240. In addition, the flux guide 218 is isolated from the lower metal gap layer 222 by an insulating layer 220. This insulating layer 220, according to some embodiments, may have a thickness of about 15 nm or more at the media facing side 208, thereby reducing the risk of shorting caused by smearing and/or scratching on the media facing side 208 of the sensor structure 240. More detailed descriptions of embodiments of the sensor structure and methods of producing a sensor structure are included below.

Now referring to FIGS. 3A-3K, a method for forming a magnetic head may be described according to one embodiment. FIGS. 3A-3K show a top down view of a structure on the left side, and a cross-sectional view of the structure taken at line A on the right side. The method may be carried out in any desired environment, and may be used to produce a magnetic head such as the magnetic head described in FIG. 4.

Referring to FIG. 3A, according to one embodiment, a shield layer 304 may be deposited, possibly on a substrate. The shield layer 304 may be comprised of any material known in the art for forming a shield, such as NiFe, CoFe, NiCoFe, and/or combinations thereof, etc. Above the shield layer 304, a nonmagnetic gap layer 302 may be deposited. The shield layer 304 and the gap layer 302 may be deposited using any technique known in the art, such as plating, sputtering, etc. The gap layer 302 may preferable be comprised of an electrically conductive and mechanically hard material, such as Ta, Cr, Rh, and/or combinations thereof, etc. However, any material known in the art that is electrically conductive and mechanically hard may be used for the gap layer 302.

Now referring to FIG. 3B, in one operation, a magnetic tunnel junction sensor structure (layers 306, 308, 310, 312) is formed. This structure may generally be referred to as a TMR sensor after it has been defined by removing extraneous portions of the sensor structure, and may be deposited above the gap layer 302. The TMR sensor, according to one embodiment, may comprise a reference layer 306, a barrier layer 308, a free layer 310, and a cap layer 312. Any type of TMR sensor as known in the relevant art may be used, and the layers comprising the TMR sensor may be deposited using any deposition method known in the art, such as plasma vapor deposition (PVD), chemical vapor deposition (CVD), full film deposition, plating, sputtering, etc. The TMR sensor may be formed in any desired shape, and is shown deposited in a shape common to semiconductor manufacturing for illustrative purposes only.

In another operation, a portion of the magnetic tunnel junction sensor structure (layers 306, 308, 310, 312) is removed for defining a TMR sensor. Any technique known to one of ordinary skill in the relevant art may be used to remove a portion of the sensor structure, such as mechanical and/or chemical milling, plasma and/or chemical etching, etc. For example, referring to FIG. 3C, a mask 314, comprised of a material known to be used in masking, such as photoresist, has been formed above the sensor structure, and exposed portions of the sensor structure have been removed via milling. Preferably, the milling process is performed until at least the barrier layer 306 has been removed. In this operation, the height of the TMR sensor is defined.

Another operation, as shown in FIG. 3D, is used to deposit an insulating layer 316 adjacent the sensor (layers 306, 308, 310, 312) preferably using a nonconformal deposition process, such as steep angle deposition. Any other deposition process may be used as would be known in the relevant art. The insulating layer 316 may be comprised of any electrically insulating material, such as alumina, $AlO_x$, $SiO_2$, $TaO_x$, etc. The insulating layer 316 may have a greater thickness in a portion of the insulating layer 316 which is away from the sensor than in a portion of the insulating layer 316 which is nearest the sensor. For example, in insulating layer portion 317, the insulating layer thickness is greater than the insulating layer thickness near insulating layer portion 315. The insulating layer 316 may preferably be deposited in a thin layer near the TMR sensor for low reluctance flux transfer when the head is operated.

In another operation, a flux guide layer 318 is deposited above the insulating layer 316 as shown in FIG. 3D. The flux guide layer 318 may be deposited using the similar techniques to the deposition of the insulating layer 316, or may be deposited in any other technique known in the art. The flux guide layer 318 may be preferably comprised of a soft ferromagnetic material with a low magnetostriction, such as NiFe, CoFe, and/or combinations thereof, etc. In some embodiments, the flux guide layer 318 may comprise a nitrogenated iron-containing alloy, such as nitrogenated NiFe, nitrogenated CoFe, nitrogenated combinations thereof, etc.

Now referring to FIG. 3E, the mask (314, FIG. 3D) may be removed, along with any layers above the mask (314, FIG. 3D), such as portions of the insulating layer 316 and portions of the flux guide layer 318. Any technique may be used to remove the mask (314, FIG. 3D), such as standard liftoff techniques, chemical mechanical polishing (CMP) assisted liftoff, etc. Once the mask (314, FIG. 3D) is removed, the flux guide 318 is separated into two portions, with the portion near the rear of the structure referred to as the rear flux guide 319. This is discussed in more detail later.

A mask 320 may be deposited above a portion of the structure, leaving a portion of the rear flux guide 319 exposed on the rear side of the structure. The rear side of the structure appears on the right side of the cross-sectional view, and on the top of the top down view. This operation may define the extent of the rear flux guide 319. If this mask 320 is placed such that the entire rear flux guide layer 319 is exposed on the rear side of the structure, then the resulting head will not have a rear flux guide 319 when the mask 320 is removed.

According to some embodiments, the method may include forming a rear flux guide 319 adjacent the sensor on an opposite side thereof than the flux guide 318. For example, in FIG. 3E, a rear flux guide 319 is formed, possibly at the same time that the flux guide 318 is formed, adjacent the sensor on an opposite side thereof than the flux guide 318. In some approaches, the method may further comprise removing a portion of the rear flux guide 319 for defining a back end thereof. This is shown in FIG. 3F, since the placement of the mask 320 did not cover the entire rear flux guide 319 near the rear side of the structure, a portion of the rear flux guide 319 could be removed, such as via milling, etching, etc. Removing a portion of the rear flux guide 319 can be useful to clear the field. Since many of the processes are full film processes, the wafer may be covered with either a portion of the flux guide or a portion of the sensor everywhere. By removing a portion of the rear flux guide 319, a small region around the sensor and flux guide can be protected while removing the metal on almost the entire wafer. If the metal is not removed, it may be exposed at the TBS 323 and the edges of the final structure and may increase the probability of shorting and/or corrosion.

With continued reference to FIG. 3F, an insulating layer 322 may be formed above the mask 320 and above the gap layer 302. This insulating layer 322 may be used to insulate the gap layer 302 from any subsequently added layers, such as a lead, upper gap layer, etc. The thickness of the insulating layer 322 is not important as long as it can insulate the gap layer 302 from other layers added above at the rear portion of the structure.

In FIG. 3G, the mask (320, FIG. 3F) has been removed, exposing the cap layer 312, flux guide layer 318, rear flux guide layer 319, and portions of the insulating layer 316. At this point, in some embodiments, a lead layer and top shield layer may be added. However, in some other embodiments, the TMR sensor may be stabilized by the addition of hard magnets.

As shown in FIG. 3H, a mask 324 may be applied to a portion of the structure, leaving portions near the front and rear side of the sensor exposed 321. The shape of these exposed portions 321 is not critical, but generally should be large enough to effectively stabilize the TMR sensor once hard magnets are deposited into the exposed portions 321.

Now referring to FIG. 3I, in some embodiments, the exposed portions 321 may be removed down to gap layer 302 or the shield layer 304. Any technique may be used to remove the exposed portions 321, such as milling, etching, etc. This step defines the width of the sensor.

With reference to FIG. 3J, the exposed portions (321, FIG. 3I) may be filled with an insulating material (not shown), and above the insulating material, a hard magnetic material 326, such as a Co based alloy with high magnetic coercivity and retentivity, e.g., CoPt, CoCr, etc. This results in insulated hard magnets 326 being formed on the front portion and rear portion of the TMR sensor, which can be used to stabilize the sensor.

Now referring to FIG. 3K, before the TBS 323 is defined, a top gap layer 328 may be formed above the structure, and a top shield layer 330 may be formed above the top gap layer 328. Any technique known in the art may be used to deposit these layers, such as plating, sputtering, etc. As can be seen in this figure, the top gap layer 328 is isolated from the gap layer 302 by the insulating layer 322. The top gap layer 328 is electrically conductive. Now the TBS 323 is defined, by removing the front portion of the structure.

Now referring to FIG. 4, a magnetic head may be described according to one embodiment. The magnetic head includes an array of data and/or servo sensor structures formed on a common substrate. The substrate may be comprised of any material as would be known to one of ordinary skill in the relevant art, such as a composite of alumina and titanium carbide. Also, each sensor structure 400 includes a magnetic tunnel junction sensor 402 spaced from a media-facing surface of the head 406, such as the tape bearing surface (TBS). Each sensor structure 400 also includes a flux guide 404 between the media-facing surface 406 of the head and the sensor 402. The flux guide 404 guides magnetic flux from a magnetic medium 408, such as a magnetic tape, adjacent the media-facing surface 406 to the sensor 402.

According to some preferred approaches, the flux guide 404 may be self aligned with the sensor 402. This enables more efficient processing of the head and flux guide 404, and minimizes the risk, time, and energy that might be expended to align the flux guide 404 and sensor 402 at a later time.

The head may also include a rear flux guide 410 positioned behind the sensor 402 relative to the media-facing surface 406, in some embodiments, in addition to the flux guide 404 previously described. This rear flux guide 410 may be useful to increase the flux seen by the sensor 402 and thus makes the sensor 402 signal larger by creating a magnetic path where a large portion of the flux can return to the shields behind the sensor 402. Without the rear flux guide 410, more of the flux returns to the shield in front of the sensor 402 and less gets dragged through the sensor 402. In further embodiments, the rear flux guide 410 may be self aligned with the sensor 402. Once again, self aligning of the rear flux guide 410 may improve on the efficiency of producing the head, and minimize the risk, time, and energy that might be expended to align the rear flux guide 410 and sensor 402 at a later time. In even more embodiments, the head may include insulated hard magnets (not shown) oriented along sides of the sensor 402 and flux guides 404, 410 for stabilizing magnetic moments of the sensor 402 and flux guides 404, 410. These insulated hard magnets may be comprised of any material known by one of ordinary skill in the relevant art that are able to stabilize magnetic moments of the sensor 402 and flux guides 404, 410, such as a Co based alloy with high magnetic coercivity and retentivity, e.g., CoPt, CoCr, etc.

According to additional approaches, and not necessarily depending on all of the embodiments and/or approaches previously described, a ratio of a track width of the sensor 402 to a total stripe height of the flux guide 404, sensor 402, and rear flux guide 410 may be greater than about 1, or alternatively, between about 1.5 and about 5.0. The track width may be more clearly understood with reference to FIG. 3J, where the top down view shows a Track Width. By increasing this ratio, shape anisotropy can be achieved which allows the magnetization to lie comfortably in the direction parallel to the TBS 406. The higher the ratio of track width to stripe height is, the more readily the magnetization will lie in the direction parallel to the TBS 406.

Referring again to FIG. 4, shield layers 412, 414 above and below the sensor 402 may be included in some embodiments, along with gap layers 416, 418 between the sensor 402 and the shield layers 412, 414. The gap layers 416, 418 may preferably be nonmagnetic and electrically conductive. Also, the gap layers 416, 418 may each have a mechanical hardness greater than the mechanical hardness of 80/20 NiFe, as would be appreciated by one of ordinary skill in the relevant art. Further, the gap layers 416, 418 may comprise a material selected from a group consisting of Rh, Cr, and Ta.

In some embodiments, the flux guide 404 and/or the rear flux guide 410 may comprise a nitrogenated iron-containing alloy, such as nitrogenated NiFe, nitrogenated CoFe, nitrogenated combinations thereof, etc.

In more approaches, a thickness of the flux guide 404 in a region of the flux guide 404 which is positioned closest to the media-facing surface 406 of the head may be between about 5 times and about 30 times as thick as a tunnel barrier layer 420 of the sensor 402.

Although not dependent on previously described embodiments and/or approaches, the head may further comprise an insulating layer 422 between the flux guide 404 and/or the rear flux guide 410 and an underlying substrate. A thickness of the insulating layer 422 in a region of the insulating layer 422 which is positioned closest to the media-facing surface 406 of the head may be greater than a thickness of the insulating layer 422 in a region of the insulating layer 422 which is positioned closest to the sensor 402.

The flux guide 404 and/or the rear flux guide 410 may have an absolute magnetostriction of about $10^{-5}\lambda$ or less, according to some preferred approaches. Magnetostriction refers to the ability of inhomogeneous stress (and thus strain) to influence the magnetization to lie in a direction relative to the stress, and can be negative or positive. In general, a magnetostrictive alloy is undesired because the stress can be very finicky. That is why low magnetostriction is desired. The stress profile is related to the deposition processes and materials and very dependent on the lapping technology. Since the final stress profile can be nonuniform, the head sensor and flux guide can find multiple natural states and fluctuate between these states causing issues with accurate readback. Limiting the magnetostriction of the flux guide 404 and/or the rear flux guide 410 is advantageous as it allows for more uniform and predictable magnetization.

Figure 5:
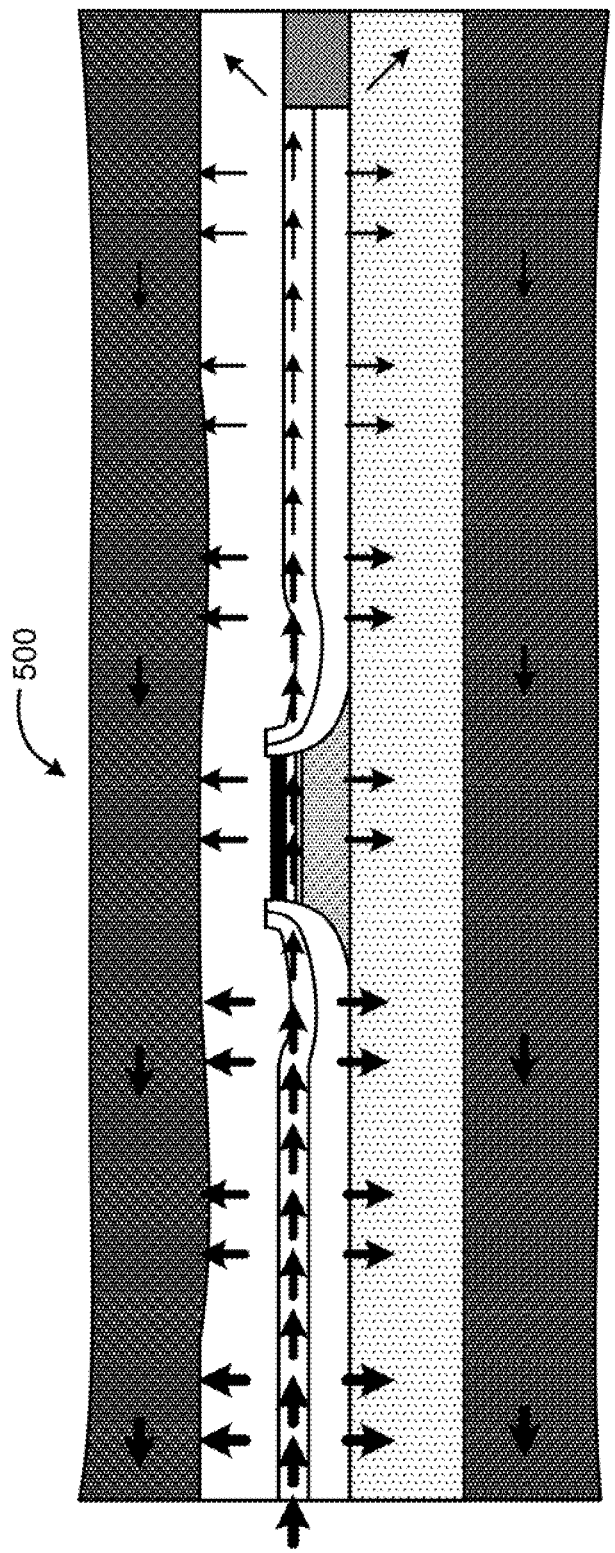
FIG. 5 is a schematic representation of a cross-sectional view of a sensor structure showing flux lines according to one embodiment.

Now referring to FIG. 5, the flux through a structure 500 is shown according to one embodiment. The flux is greatest near the media facing surface 508 of the structure 500, denoted by thicker arrows. As the flux moves through the structure 500, it grows weaker and weaker, denoted by progressively thinner arrows. The flux moves toward the sensor 502 as directed by the flux guide 510. After the flux passes through the sensor 502 causing a reading, it continues along the rear flux guide 512 away from the media facing surface 508 of the structure 500. Also, some flux moves toward the shields 504, 506 above and below the sensor 502 as it travels through the structure 500, and is then returned to the media near the media facing surface 508 of the structure 500. The flux guide 510 and rear flux guide 512 enable the sensor 502 to be placed away from the media facing surface 508 of the structure 500 while continuing to be capable of reading flux from the media. This eliminates shorting of the sensor 502 due to smearing and/or scratching, according to some preferred embodiments.

It should be noted that methodology presented herein for at least some of the various embodiments may be implemented, in whole or in part, in computer hardware, software, by hand, using specialty equipment, etc., and combinations thereof.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic head, comprising:
an array of sensor structures formed on a common substrate, each sensor structure further comprising:
a magnetic tunnel junction sensor spaced from a media-facing surface of the head; and
a flux guide between the media-facing surface of the head and the sensor, the flux guide guiding magnetic flux from a magnetic medium adjacent the media-facing surface to the sensor.

2. The head of claim 1, wherein the flux guide is self aligned with the sensor.

3. The head of claim 1, further comprising a rear flux guide positioned behind the sensor relative to the media-facing surface.

4. The head of claim 3, wherein the rear flux guide is self aligned with the sensor.

5. The head of claim 3, further comprising insulated hard magnets oriented along sides of the sensor and flux guides for stabilizing magnetic moments of the sensor and flux guides.

6. The head of claim 3, wherein a ratio of a track width of the sensor to a total stripe height of the flux guide, sensor and rear flux guide is greater than 1.

7. The head of claim 3, wherein a ratio of a track width of the sensor to a total stripe height of the flux guide, sensor and rear flux guide is between about 1.5 and about 5.0.

8. The head of claim 1, further comprising shield layers above and below the sensor, and gap layers between the sensor and the shield layers, wherein the gap layers are nonmagnetic and electrically conductive, wherein the gap layers each have a mechanical hardness greater than 80/20 NiFe.

9. The head of claim 8, wherein the gap layers comprise a material selected from a group consisting of Rh, Cr and Ta.

10. The head of claim 1, wherein the flux guide comprises a nitrogenated iron-containing alloy.

11. The head of claim 1, wherein a thickness of the flux guide in a region thereof positioned closest to the media-facing surface is between about 5 and about 30 times as thick as a tunnel barrier layer of the sensor.

12. The head of claim 1, further comprising an insulating layer between the flux guide and an underlying substrate, wherein a thickness of the insulating layer in a region thereof positioned closest to the media-facing surface is greater than a thickness of the insulating layer in a region thereof positioned closest to the sensor.

13. The head of claim 1, wherein the flux guide has an absolute magnetostriction of about $10^{-5}\lambda$ or less.

14. A magnetic tape head, comprising:
an array of sensor structures, each sensor structure further comprising:
a magnetic tunnel junction sensor spaced from a media-facing surface of the head;
a flux guide between the media-facing surface of the head and the sensor, the flux guide guiding magnetic flux from a magnetic medium adjacent the media-facing surface to the sensor;
a rear flux guide positioned behind the sensor relative to the media-facing surface;
shield layers above and below the sensor; and
nonmagnetic, electrically conductive gap layers between the sensor and the shield layers.

15. The head of claim 14, wherein the flux guide is self aligned with the sensor, wherein the rear flux guide is self aligned with the sensor.

16. The head of claim 14, further comprising insulated hard magnets oriented along sides of the sensor and flux guides for stabilizing magnetic moments of the sensor and flux guides.

17. The head of claim 14, wherein a ratio of a track width of the sensor to a total stripe height of the flux guide, sensor and rear flux guide is greater than 1.

18. The head of claim 14, wherein a ratio of a track width of the sensor to a total stripe height of the flux guide, sensor and rear flux guide is between about 1.5 and about 5.0.

19. The head of claim 14, wherein the flux guide comprises a nitrogenated iron-containing alloy.

20. The head of claim 14, wherein a thickness of the flux guide in a region thereof positioned closest to the media-facing surface is between about 5 and about 30 times as thick as a tunnel barrier layer of the sensor.

21. The head of claim 14, wherein the flux guide has a magnetostriction of about $10^{-5}\lambda$ or less.

22. The head of claim 14, further comprising an insulating layer between the flux guide and an underlying substrate, wherein a thickness of the insulating layer in a region thereof positioned closest to the media-facing surface is greater than a thickness of the insulating layer in a region thereof positioned closest to the sensor.

* * * * *